(12) United States Patent
Hsieh

(10) Patent No.: US 8,889,514 B2
(45) Date of Patent: Nov. 18, 2014

(54) TRENCH MOSFET HAVING A TOP SIDE DRAIN

(71) Applicant: Force Mos Technology Co., Ltd., New Taipei (TW)

(72) Inventor: Fu-Yuan Hsieh, New Taipei (TW)

(73) Assignee: Force Mos Technology Co., Ltd., New Taipei (TW)

( * ) Notice: Subject to any disclaimer, the term of this patent is extended or adjusted under 35 U.S.C. 154(b) by 0 days.

(21) Appl. No.: 14/149,172

(22) Filed: Jan. 7, 2014

(65) Prior Publication Data

US 2014/0120672 A1 May 1, 2014

Related U.S. Application Data

(62) Division of application No. 13/371,496, filed on Feb. 13, 2012, now Pat. No. 8,653,587.

(51) Int. Cl.
| | |
|---|---|
| H01L 21/336 | (2006.01) |
| H01L 29/78 | (2006.01) |
| H01L 29/66 | (2006.01) |
| H01L 29/08 | (2006.01) |

(52) U.S. Cl.
CPC ...... *H01L 29/0882* (2013.01); *H01L 29/66734* (2013.01); *H01L 29/78* (2013.01)
USPC 438/270; 257/330; 257/E21.41; 257/E29.262

(58) Field of Classification Search
CPC ............ H01L 29/4236; H01L 29/7811; H01L 29/7813; H01L 29/66734

USPC ............ 257/E21.629, E21.41, E29.262, 330; 438/270

See application file for complete search history.

(56) References Cited

U.S. PATENT DOCUMENTS

| | | | | |
|---|---|---|---|---|
| 5,877,528 | A * | 3/1999 | So ................................. | 257/341 |
| 6,388,286 | B1 * | 5/2002 | Baliga ........................... | 257/330 |
| 2003/0047777 | A1 * | 3/2003 | In't Zandt et al. ............ | 257/329 |
| 2008/0035993 | A1 * | 2/2008 | Cao et al. ...................... | 257/333 |
| 2008/0042172 | A1 * | 2/2008 | Hirler et al. .................. | 257/288 |
| 2009/0057756 | A1 * | 3/2009 | Hshieh .......................... | 257/330 |
| 2009/0085105 | A1 * | 4/2009 | Su et al. ........................ | 257/330 |
| 2010/0123185 | A1 * | 5/2010 | Hsieh ............................ | 257/328 |
| 2010/0123192 | A1 * | 5/2010 | Burke et al. .................. | 257/334 |
| 2010/0237414 | A1 * | 9/2010 | Hsieh ............................ | 257/337 |
| 2011/0006363 | A1 * | 1/2011 | Hsieh ............................ | 257/330 |
| 2011/0127603 | A1 * | 6/2011 | Burke et al. .................. | 257/331 |
| 2012/0068231 | A1 * | 3/2012 | Garnett ......................... | 257/263 |

* cited by examiner

*Primary Examiner* — Cheung Lee
*Assistant Examiner* — Jeremy Joy
(74) *Attorney, Agent, or Firm* — Bacon & Thomas, PLLC

(57) ABSTRACT

This invention discloses a trench MOSFET comprising a top side drain region in a wide trench in a termination area besides a BV sustaining area, wherein said top side drain comprises a top drain metal connected to an epitaxial layer and a substrate through a plurality of trenched drain contacts, wherein the wide trench is formed simultaneously when a plurality of gate trenches are formed in an active area, and the trenched drain contacts are formed simultaneously when a trenched source-body contact is formed in the active area.

1 Claim, 22 Drawing Sheets

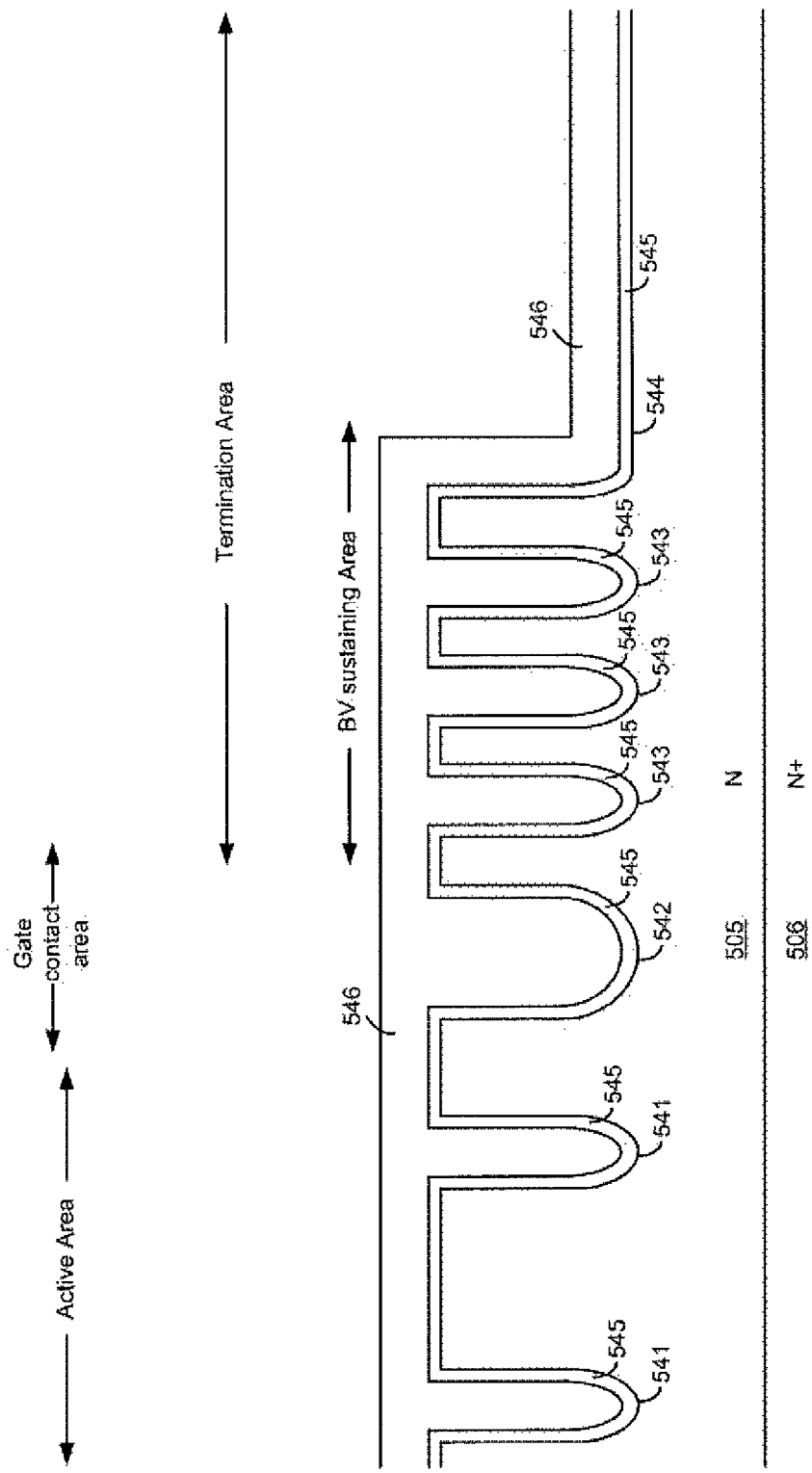

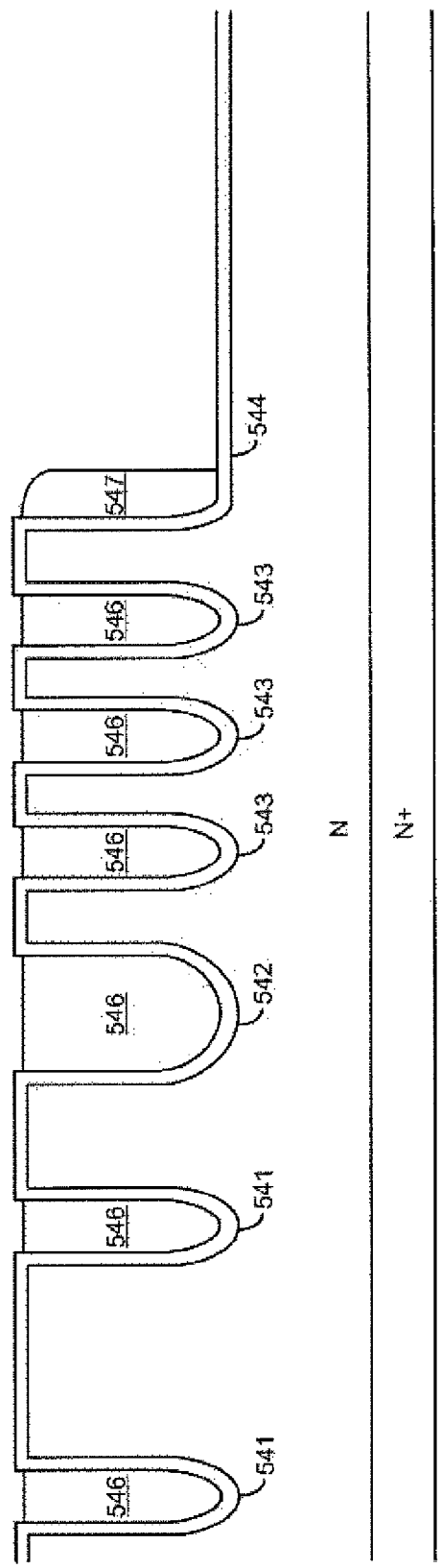

TRENCH MOSFET HAVING A TOP SIDE DRAIN

FIELD OF THE INVENTION

This invention relates generally to the cell structure, device configuration and fabrication process of semiconductor power devices. More particularly, this invention relates to a novel and improved cell structure, device configuration and improved fabrication process of semiconductor power device having a top side drain.

BACKGROUND OF THE INVENTION

Flip chip package relates to a chip scale package and makes mounting a chip on a circuit board or other electric interface very convenient by using one surface of the chip. For a trench MOSFET (Metal Oxide Semiconductor Field Effect Transistor), gate, source and drain metals for external connection should be placed on one surface of the trench MOSFET, and can be bonded with solder balls on their surfaces for flip chip packaging. Trench MOSFET having a top side drain can be integrated with integrated circuit for some applications and for package foot print reduction.

Please refer to FIG. 1A for a prior art U.S. Pat. No. 7,352,036 which disclosed an N-channel trench MOSFET 100 having a top side drain by using a deep sinker trench 101 filled with a conductive material 102 and extending from a top surface of an n− epitaxial layer 103 down to an n+ substrate 104. A dielectric layer 105 only lining the sinker trench 101 sidewalls insulates the conductive material 102 from the n− epitaxial layer 103. However, the process to form the deep sinker trench 101 and the conductive material 102 is complicated and not cost effective. Firstly, the deep sinker trench 101 is formed with an additional mask; secondly, forming the deep sinker trench 101 needs extra deep dry silicon etch; thirdly, an additional oxide etch is needed to remove the dielectric layer 105 from trench bottom of the deep sinker trench 101. FIG. 1B shows a P-channel trench MOSFET 110 having a top side drain according to another prior art U.S. Pat. No. 6,653,740. In FIG. 1B, a P+ substrate 111 is used and a P epitaxial layer 112 is grown atop the P+ substrate 111. A drain metal 113 is shown as contacting an upwardly extending portion of the P+ substrate 111. The trench MOSFET 110 is also formed through a complicated and not cost effective process. Firstly, a deep and wide trench 114 is etched into the P+ substrate 111 to form an active area; secondly, the P epitaxial layer 112 is formed and additional CMP (Chemical Mechanical Polishing) is required to remove excess epitaxial layer from the P+ substrate 111. According to the same prior art U.S. Pat. No. 6,653,740, another P-channel trench MOSFET 120 having bidirectional structure is shown in FIG. 1C, which has a high on-resistance suffered from additional channel resistance and drift region resistance.

Therefore, there is still a need in the art of the semiconductor power device, particularly for trench MOSFET design and fabrication, to provide a novel cell structure, device configuration and fabrication process that would resolve these difficulties and reduce the manufacturing cost.

SUMMARY OF THE INVENTION

It is therefore an aspect of the present invention to provide a trench MOSFET having a top side drain which requires no additional mask or additional deep trench to achieve a better cost effective and better effective area utilization than the prior arts by forming a top side drain in a termination area of the trench MOSFET. Briefly, according to the present invention, there is provided a trench MOSFET having a top side drain comprising: a substrate of a first conductivity type; an epitaxial layer of the first conductivity type onto the substrate, wherein the epitaxial layer has a lower doping concentration than the substrate; a top side drain formed in a wide trench in a termination area and comprising a top drain metal connected to the epitaxial layer through a plurality of trenched drain contacts each filled with a contact metal plug, wherein the wide trench is formed simultaneously when a plurality of gate trenches are formed in an active area; a BV (Breakdown Voltage) sustaining area formed in the termination area and adjacent to the top side drain.

The advantage of the present invention is that, the top side drain is formed in a wide trench in the termination area adjacent to the BV sustaining area, wherein the wide trench is formed simultaneously when a plurality of gate trenches are formed in the active area, as well as when a gate contact trench is formed in a gate contact area, meanwhile, the trenched drain contacts are formed simultaneously when a trenched source-body contact is formed to connect a source region and a body region in the active area to a source metal, as well as when a trenched gate contact is formed to connect gate material filling in the gate contact trench in the gate contact area to a gate metal, therefore, no additional mask and no additional deep trench are required. According to another aspect of the present invention, the trench MOSFET further comprises a back drain metal on rear side of the substrate, wherein the back drain metal has a resistivity about 5~10 times lower than the substrate so that a drain-source current flows from the top drain metal through the substrate vertically, back drain metal laterally, then drift region and the channel region to the source metal.

According to another aspect of the present invention, in some preferred embodiments, the BV sustaining area in the termination area can be implemented by comprising multiple trenched floating gates formed in multiple floating trenches which are formed simultaneously when the wide trench in the termination area is formed. In some other preferred embodiments, the BV sustaining area in the termination area also can be implemented by comprising a metal field plate atop a body dopant region in the termination area. In some other preferred embodiment, the BV sustaining area in the termination area also can be implemented by comprising a trenched sidewall spacer close to a sidewall of the wide trench as a field plate and connected to the source metal. In some other preferred embodiments, the BV sustaining area in the termination area also can be implemented by comprising multiple trenched floating gates and a trenched sidewall spacer close to a sidewall of the wide trench. In some other preferred embodiments, the BV sustaining BY area in the termination area can be implemented by comprising a metal field plate and a trenched sidewall spacer close to a sidewall of the wide trench.

According to another aspect of the present invention, in some preferred embodiments, the source region can be formed by lateral diffusion, therefore has a higher doping concentration and a greater junction depth near sidewalls of the trenched source-body contact than near a channel region at a same distance from a top surface of the epitaxial layer in the active area. In some other preferred embodiment, the source region can be also formed by vertical diffusion, therefore has a same doping concentration and a same junction depth from the sidewalls of the trenched source-body contact to the channel region at a same distance from the top surface of the epitaxial layer.

According to another aspect of the present invention, in some preferred embodiment, the source metal, the gate metal, and the top drain metal can be implemented by using Al alloys which are respectively bounded, with Au, Cu or Al wire. In some other preferred embodiment, the source metal, the gate metal and the top drain metal can be also implemented by using Ti/Ni/Ag or Ti/Ni which are respectively bounded with solder ball for flip chip packaging.

According to another aspect of the present invention, a sinker region heavily doped with the first conductivity type is formed in the epitaxial layer under the wide trench and reaching the substrate to further reduce Rds (the resistance between drain and source). In some other preferred embodiment, the sinker region heavily doped with the first conductivity type can be also formed in the epitaxial layer under the wide trench and not reaching the substrate.

The present invention further comprises a method for manufacturing a trench MOSFET having a top side drain, comprising: forming an epitaxial layer of a first conductivity type onto a substrate of the first conductivity type, wherein the epitaxial layer has a lower doping concentration than the substrate; applying a trench mask and etching a plurality of trenches to a determined depth in the epitaxial layer, wherein the trenches include: a plurality of gate trenches in an active area, a gate contact trench in a gate contact area and a wide trench in a termination area; forming a gate oxide layer along inner surfaces of all the trenches and depositing gate material onto the gate oxide layer to fill into the trenches; carrying out a body dopant ion implantation over entire top surface without a body mask and performing body diffusion step to form body region of a second conductivity type; depositing a thick oxide layer onto the entire top surface to function as a contact interlayer; applying a contact mask and etching the contact interlayer to form a plurality of contact holes to expose a part top surface of the epitaxial layer; carrying out source dopant ion implantation without a source mask over the entire top surface; performing a source dopant diffusion to laterally diffuse the source dopant from a center portion between two adjacent gate trenches in the active area to adjacent channel regions; etching the epitaxial layer to further extend the contact holes in the epitaxial layer; forming a contact metal plug in each of the contact holes; depositing a front metal and applying a metal mask to pattern the front metal into a source metal, a gate metal and a top drain metal.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIGS. 6A~6H are a serial of side cross-sectional views for showing the processing steps for fabricating the trench MOSFET of FIG. 5A.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
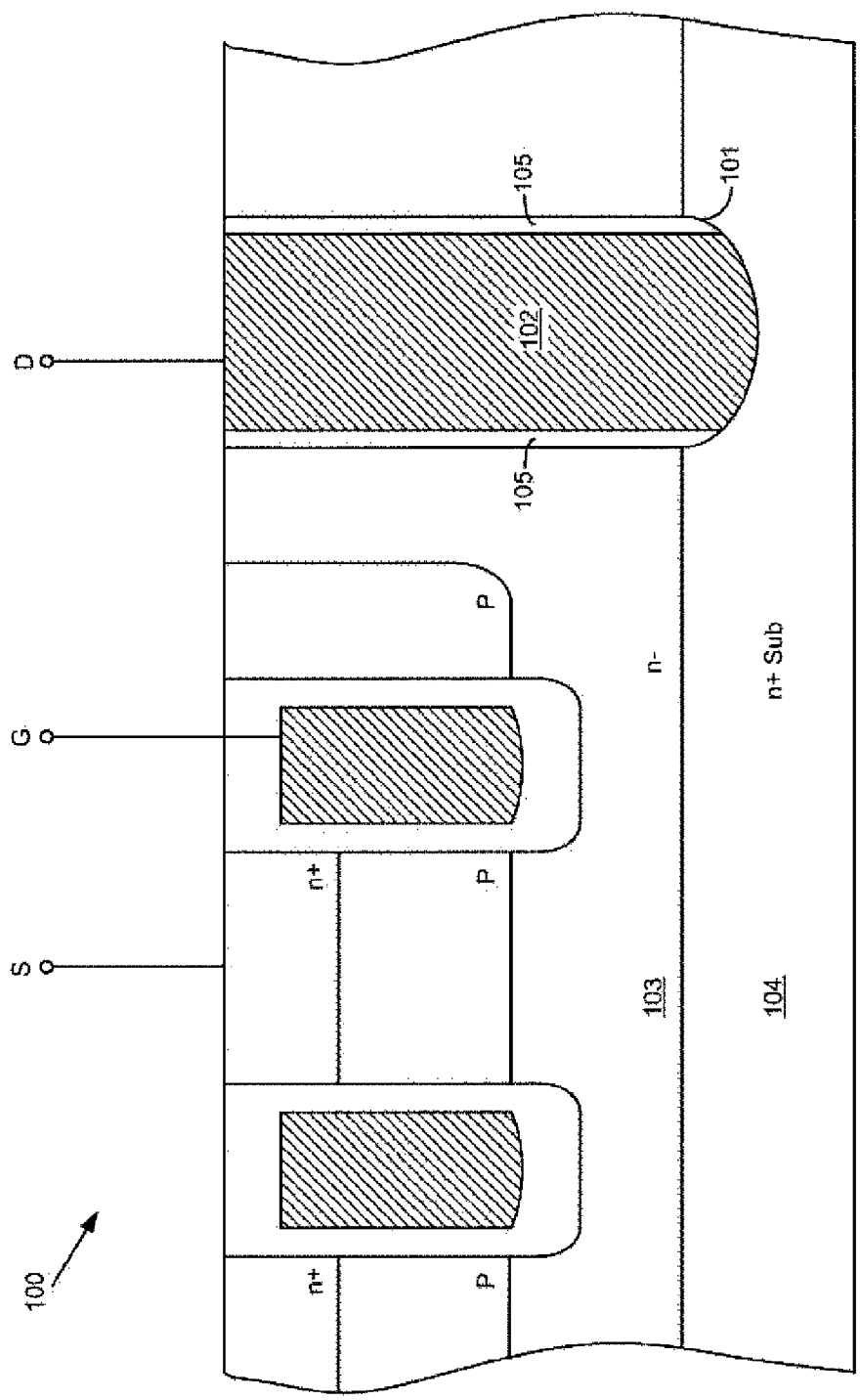
FIG. 1A is a cross-sectional view of a trench MOSFET having a top side drain of a prior art.
Figure 1B:
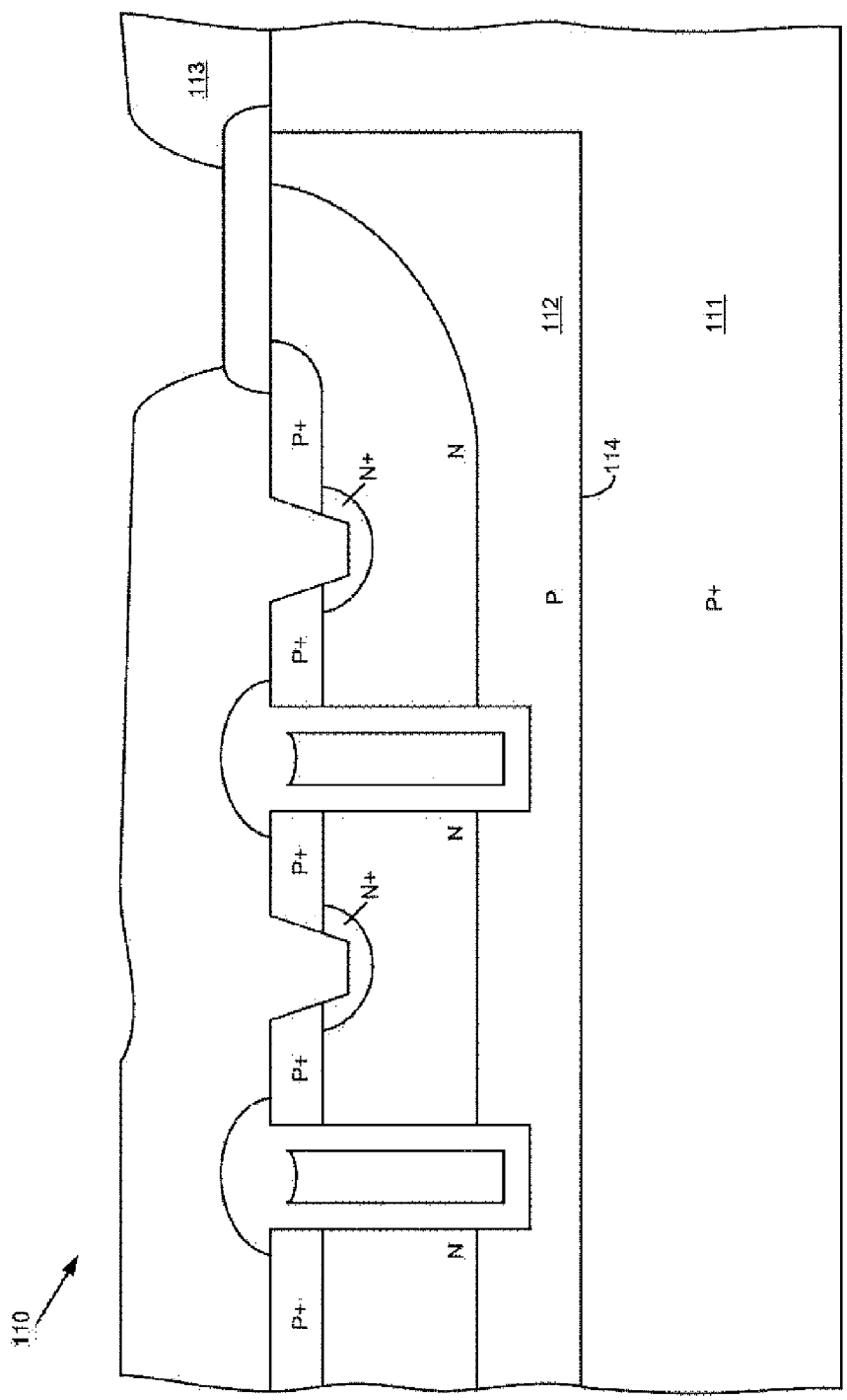
FIG. 1B is a cross-sectional view of a trench MOSFET having a top side drain of another prior art.
Figure 1C:
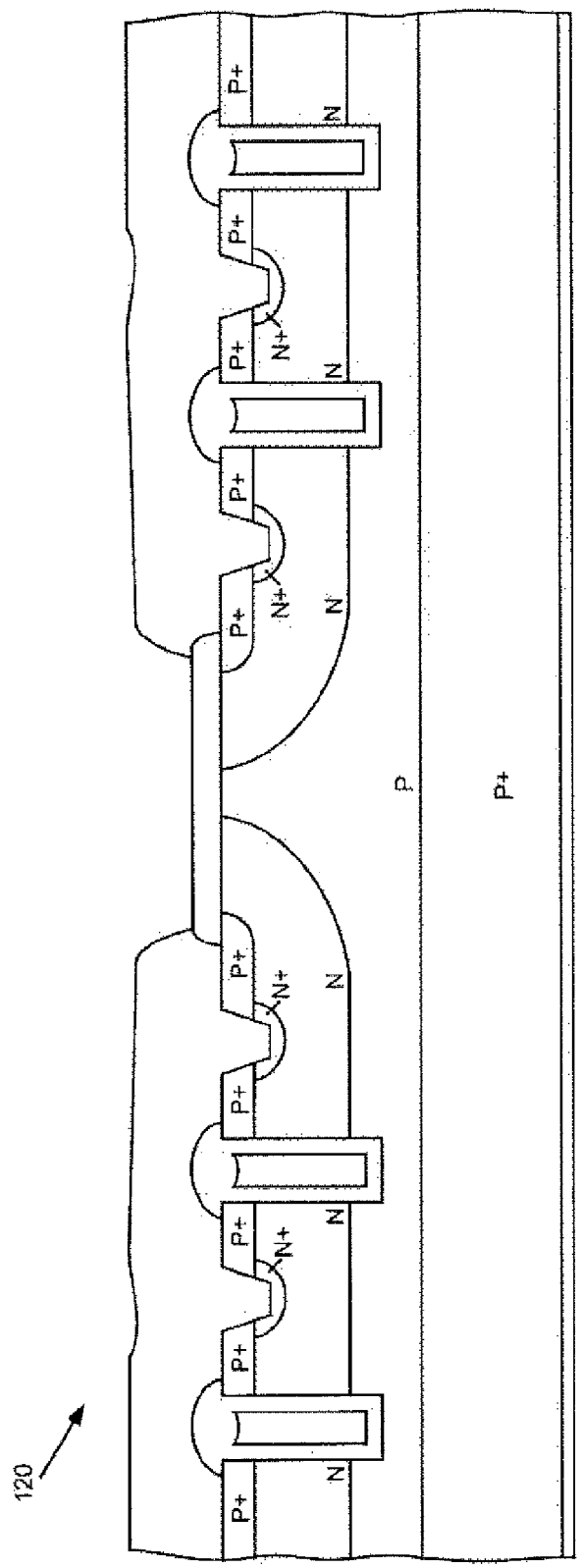
FIG. 1C is a cross-sectional view of another trench MOSFET having a top side drain of the prior art.
Figure 2A:
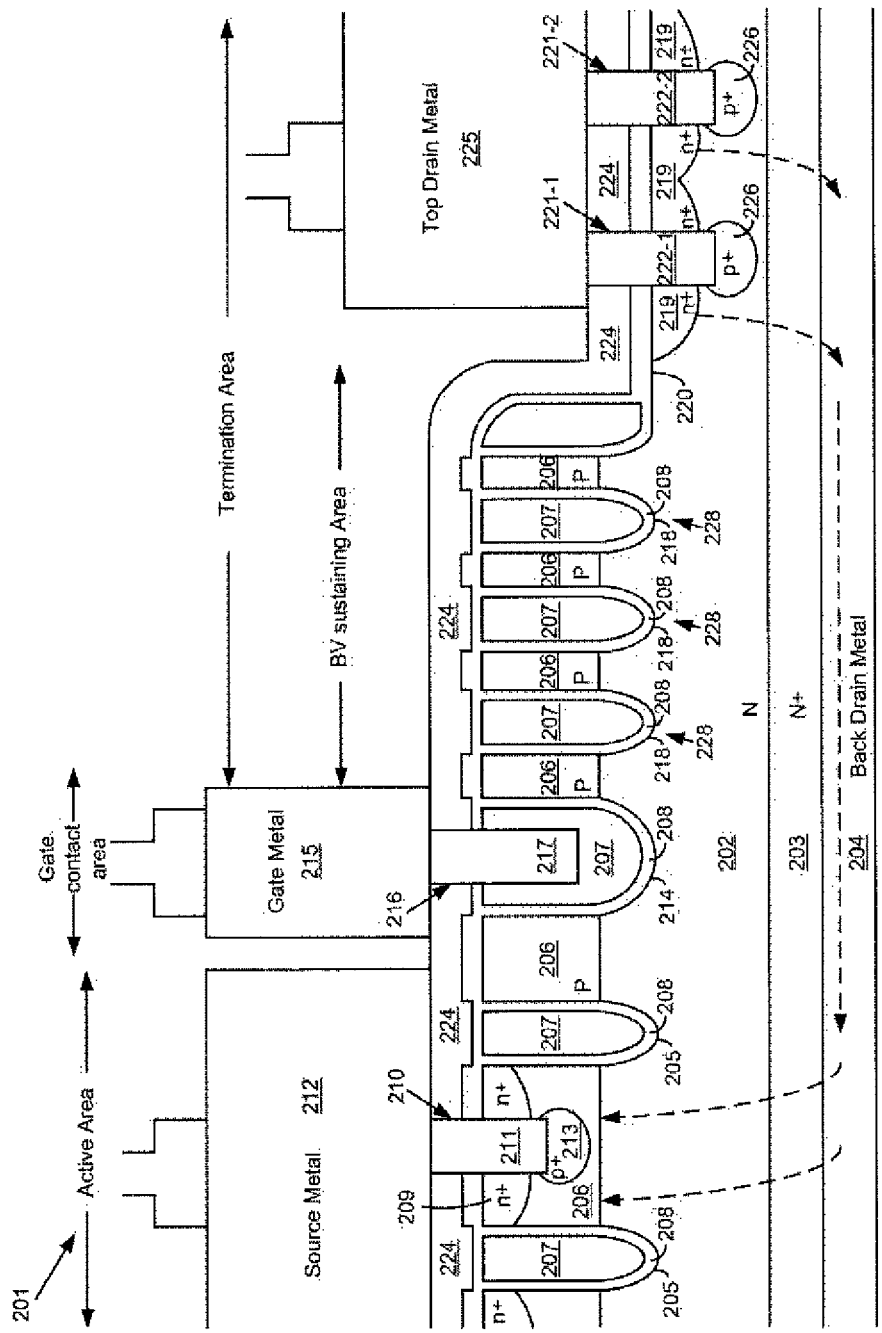
FIG. 2A is a cross-sectional view of a preferred embodiment according to the present invention.

Please refer to FIG. 2A for a preferred embodiment of this invention wherein an N-channel trench MOSFET 201 is formed in an N epitaxial layer 202 onto an N+ substrate 203 coated with a back drain metal 204 of Ti/Ni/Ag or Ti/Ni/Au on rear side, wherein the back drain metal 204 has a resistivity of 5~10 times lower than the substrate 203. A plurality of gate trenches 205 are formed extending from a top surface of the N epitaxial layer 202 and spaced apart by P body region 206 in an active area. Each of the gate trenches 205 is filled with gate material 207 padded by a gate oxide layer 208 which has a same thickness along sidewalls and a bottom of each the gate trench 205 or has a thickness along the bottom greater than along the sidewalls of each the gate trench 205. An n+ source region 209 is encompassed in the P body region 206 and flanking the gate trenches 205. A trenched source-body contact 210 filled with a contact metal plug 211, for example, a tungsten plug, is penetrating through an oxide interlayer 224, the n+ source region 209 and extending into the P body region 206, connecting the P body region 206 and the n+ source region 209 to a source metal 212 atop the contact interlayer 224. The n+ source region 209 is formed by lateral diffusion and has a higher doping concentration and a greater junction depth along sidewalls of the trenched source-body contact 210 than along an adjacent channel region near gate trenches 205 at a same distance from the top surface of the N epitaxial layer 202. A p+ body contact doped region 213 within the P body region 206 and surrounding at least bottom of the trenched source-body contact 210 is formed underneath the n+ source region 209 to reduce the contact resistance between the contact metal plug 211 and the P body region 206. In a gate contact area, at least a gate contact trench 214 having a greater trench width than and formed in a same fabrication step as the gate trenches 205 in the active area is formed filling with the gate material 207 padded by the gate oxide layer 208, wherein the gate material 207 in the gate contact trench 214 is connected to a gate metal 215 atop the oxide interlayer 224 through a trenched gate contact 216 filled with a contact metal plug 217 (the same as the contact metal plug 211) for gate connection. A termination area comprises a BV (Breakdown Voltage) sustaining area and an adjacent top side drain, wherein the By sustaining area comprises multiple trenched floating gates 218 implemented by filling gate material 207 into in multiple floating trenches 218 which are spaced apart by the P body regions 206, wherein the gate material 207 in the multiple floating trenches 218 has floating voltage to sustain breakdown voltage, for the trenched MOSFET. The top side drain formed in a wide trench 220 in the termination area comprises a top drain metal 225 which is connected to the N epitaxial layer 202 through a plurality of trenched drain contacts 221-1 and 221-2 respectively filled with contact metal plugs 222-1 and 222-2 (the same as the contact metal plug 223) and extending into the N epitaxial layer 202. The trenched drain contacts 221-1 and 221-2 are formed simultaneously when the trenched source-body contact is formed in the active area, therefore are each surrounded by an n+ source dopant region 219 and wrapped by a p+ body contact dopant region 226 around at least bottom of each of the trenched drain contacts. As illustrated by dashed-line arrows in the FIG. 2A, a drain-source current flows when the trench MOSFET 201 is biased in the "on" state, wherein the drain-source current first from the top drain metal 225 vertically down through the N epitaxial layer 202 and the N+ substrate 203, then laterally through the very low resistance back drain metal 204, and then vertically up through drift region and the channel region in the active area to the n+ source region 209 and further to the source metal 212. A sidewall spacer 227 comprising a poly-silicon is formed along a sidewall of the wide trench 220. The source metal 212, the gate metal. 215 and the top drain metal 225 are all implemented by comprising Al alloys respectively bonded with Au, Cu or Al wire.

Figure 2B:
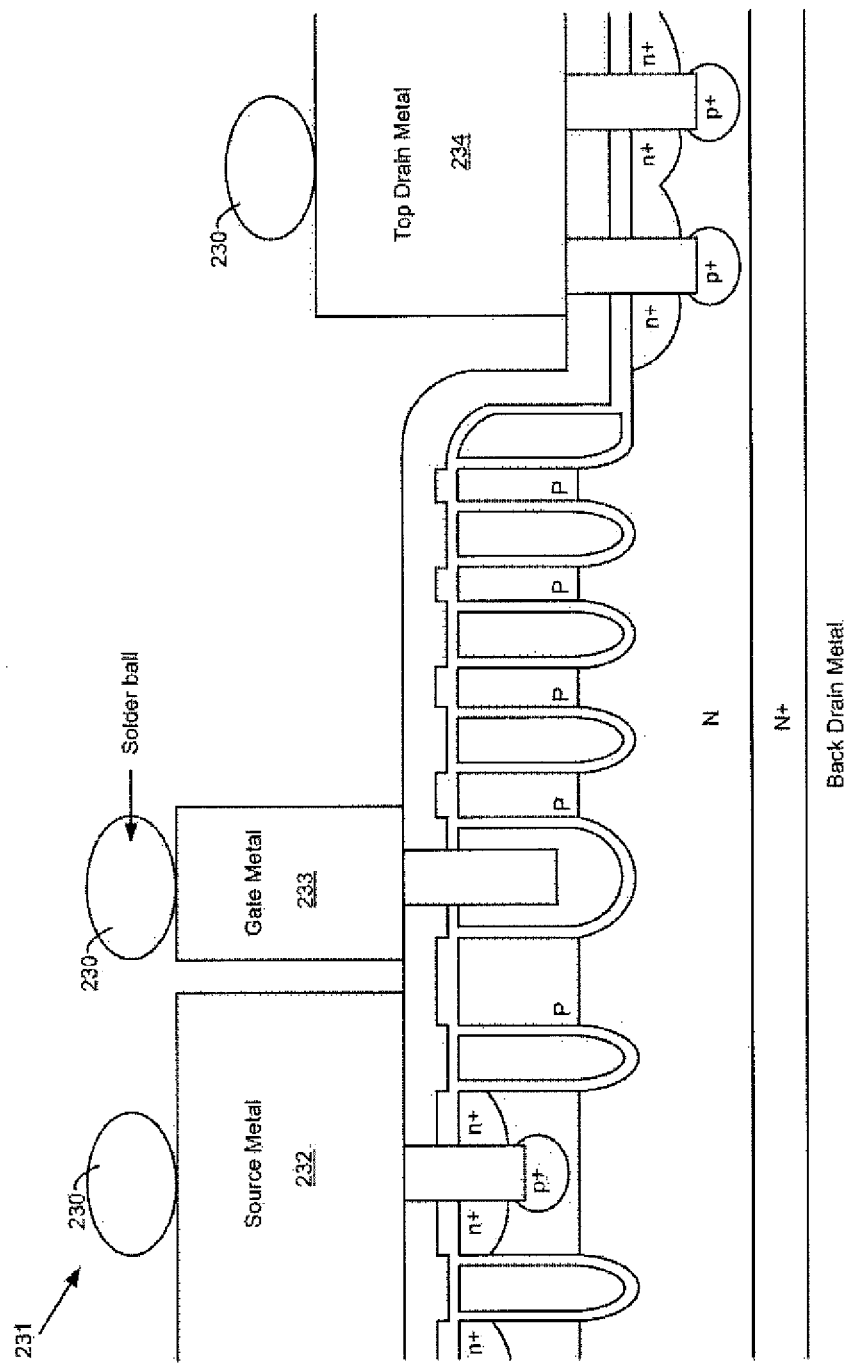
FIG. 2B is a cross-sectional view of another preferred embodiment according to the present invention.

FIG. 2B shows another preferred embodiment according to the present invention, wherein an N-channel trench MOSFET 231 is similar to the trench MOSFET 201 of FIG. 2A except that, in FIG. 2B, the source metal 232, the gate metal 233, and the top drain metal 234 are implemented by comprising a metal layer of Ti/Ni/Ag or Ti/Ni/Au respectively bonded with a solder ball 230 on it for flip chip packaging.

Figure 2C:
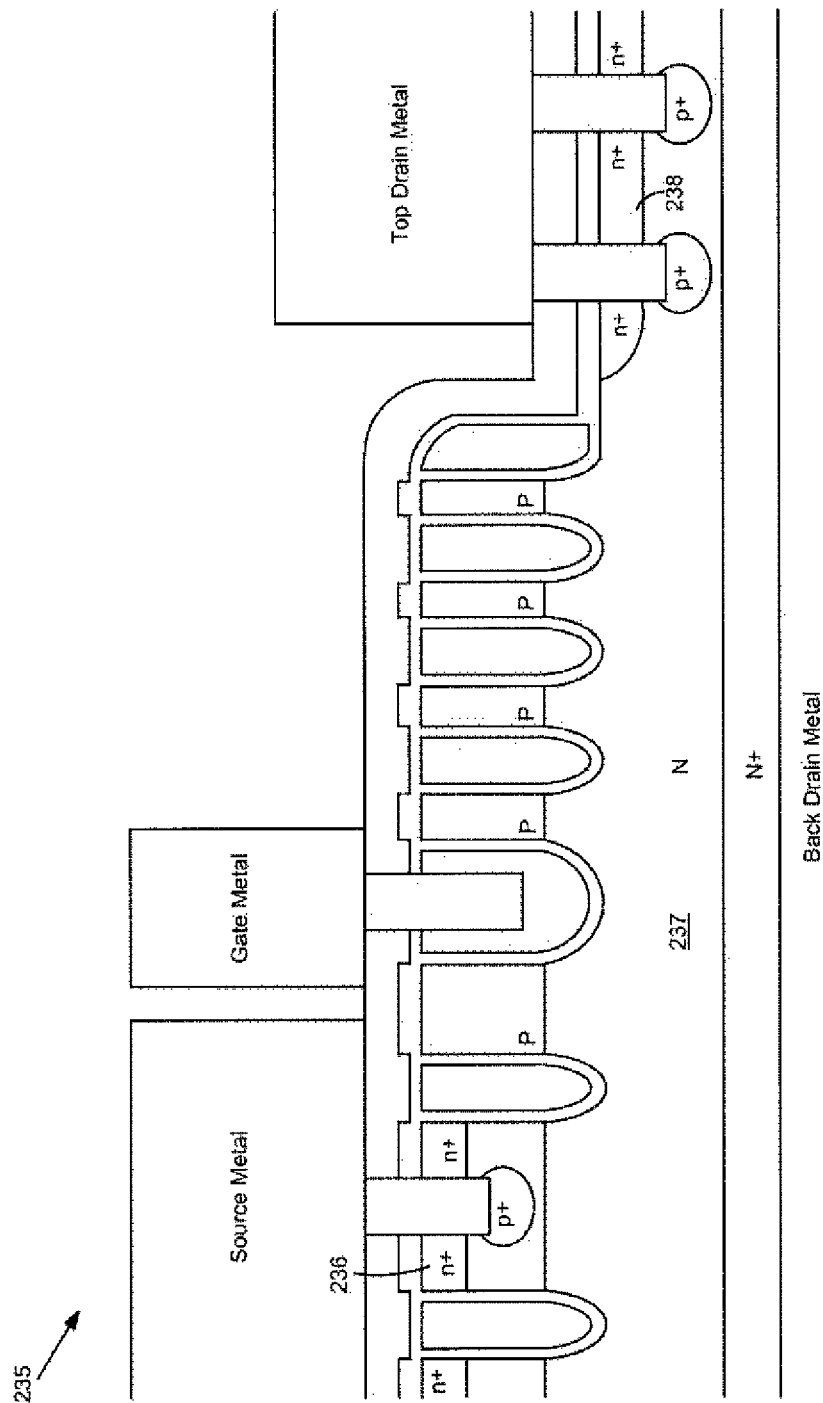
FIG. 2C is a cross-sectional view of another preferred embodiment according to the present invention.

FIG. 2C shows another preferred embodiment according to the present invention, wherein an N-channel trench MOSFET 235 is similar to the trench MOSFET 201 of FIG. 2A except that, in FIG. 2C, the n+ source region 236 is formed by vertical diffusion, therefore has a same doping concentration and a same junction depth at a same distance from a top surface of the N epitaxial layer 237. The n+ source dopant region 238 is formed simultaneously when the n+ source region 236 is formed, therefore has a similar distribution profile to the n+ source region 236.

Figure 3A:
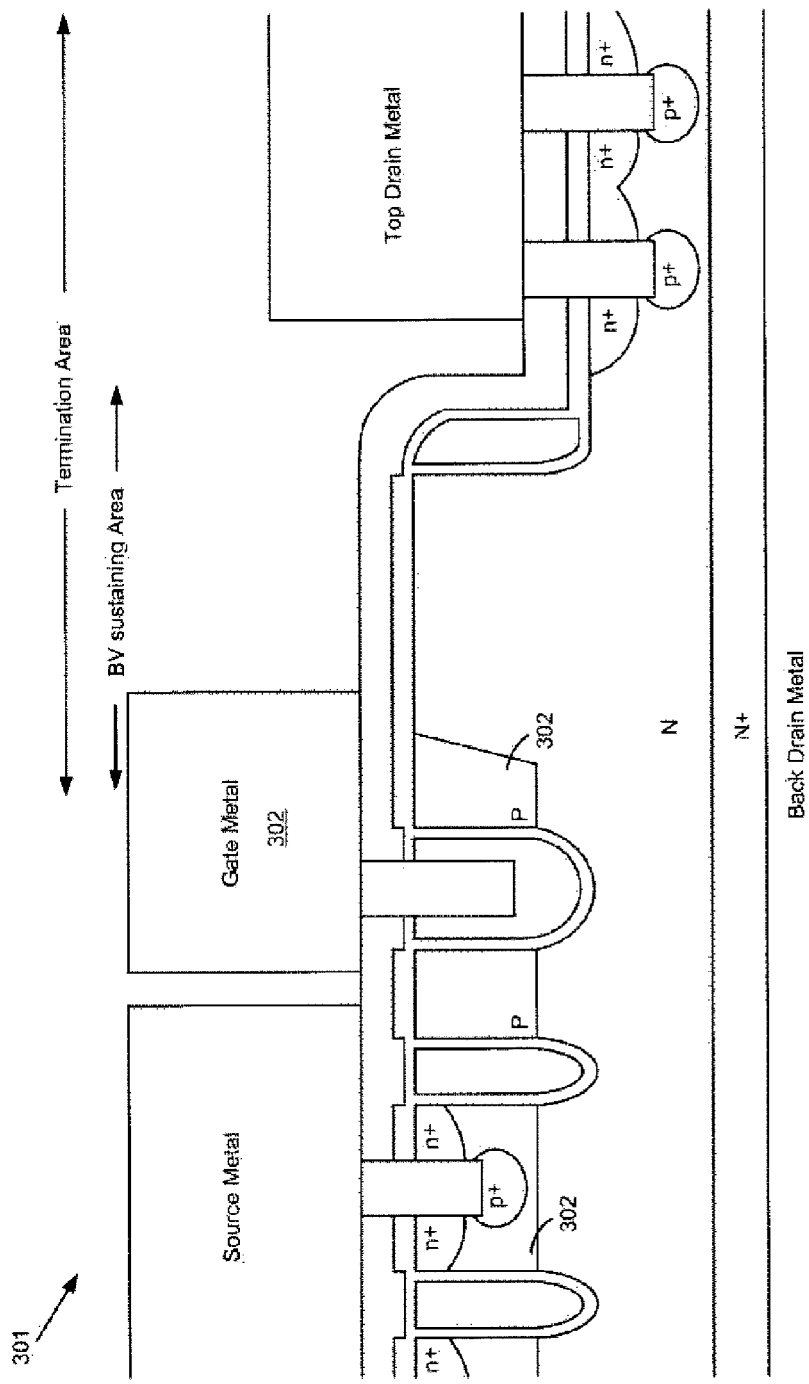
FIG. 3A is a cross-sectional view of another preferred embodiment according to the present invention.

FIG. 3A shows another preferred embodiment according to the present invention, wherein an N-channel trench MOSFET 301 is similar to the trench MOSFET 201 of FIG. 2A except that, in FIG. 3A, the BY sustaining area comprises metal field plate 302 which is implemented by extending the gate metal to further cover a P body dopant region 302 in the termination area, wherein the P body dopant region 302 is formed simultaneously when the P body region 303 is formed in the active area.

Figure 3B:
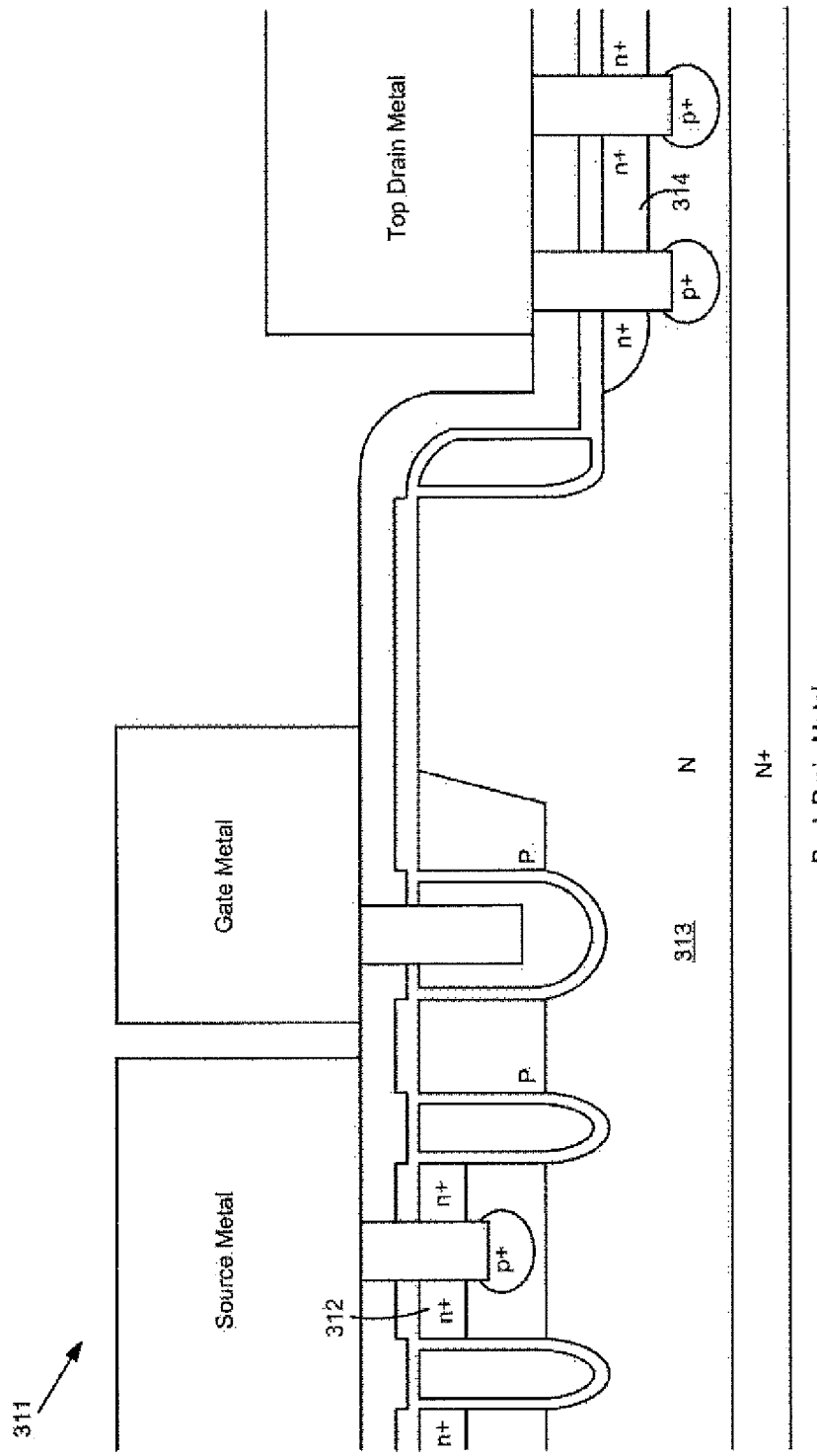
FIG. 3B is a cross-sectional view of another preferred embodiment according to the present invention.

FIG. 3B shows another preferred embodiment according to the present invention, wherein an N-channel trench MOSFET 311 is similar to the trench MOSFET 301 of FIG. 3A except that, in FIG. 3B, the n+ source region 312 is formed by vertical diffusion, therefore has a same doping concentration and a same junction depth at a same distance from a top surface of the N epitaxial layer 313. The n+ source dopant region 314 is formed simultaneously when the n+ source region 312 is formed, therefore has a similar distribution profile to the n+ source region 312.

Figure 4A:
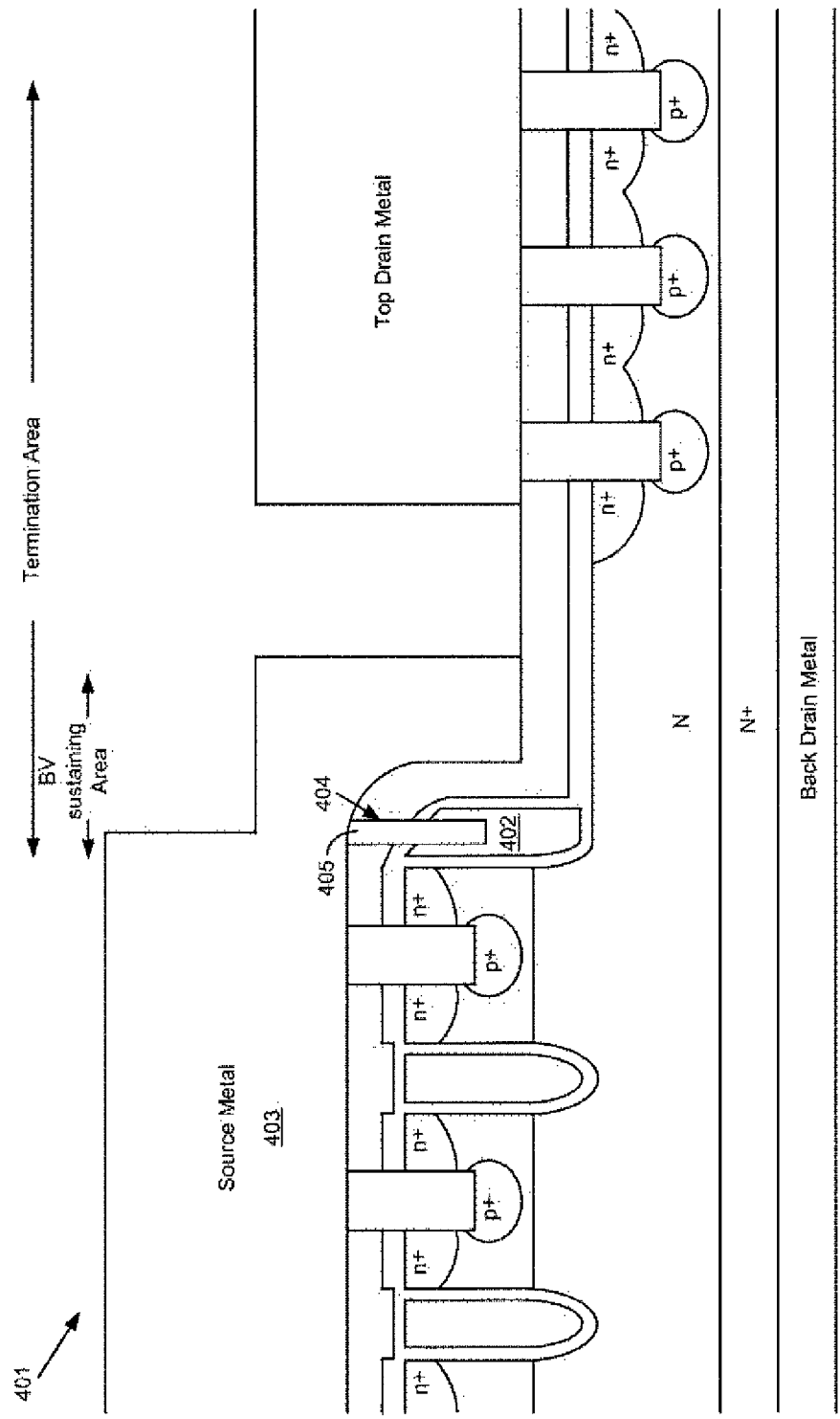
FIG. 4A is a cross-sectional view of another preferred embodiment according to the present invention.

FIG. 4A shows another preferred embodiment according to the present invention, wherein an N-channel trench MOSFET 401 is similar to the trench MOSFET 201 of FIG. 2A except that, in FIG. 4A, the BV sustaining area comprises a trenched sidewall spacer 402 as field plate which is connected to the source metal 403 through a trenched spacer contact 404 filled with the contact metal plug 405.

Figure 4B:
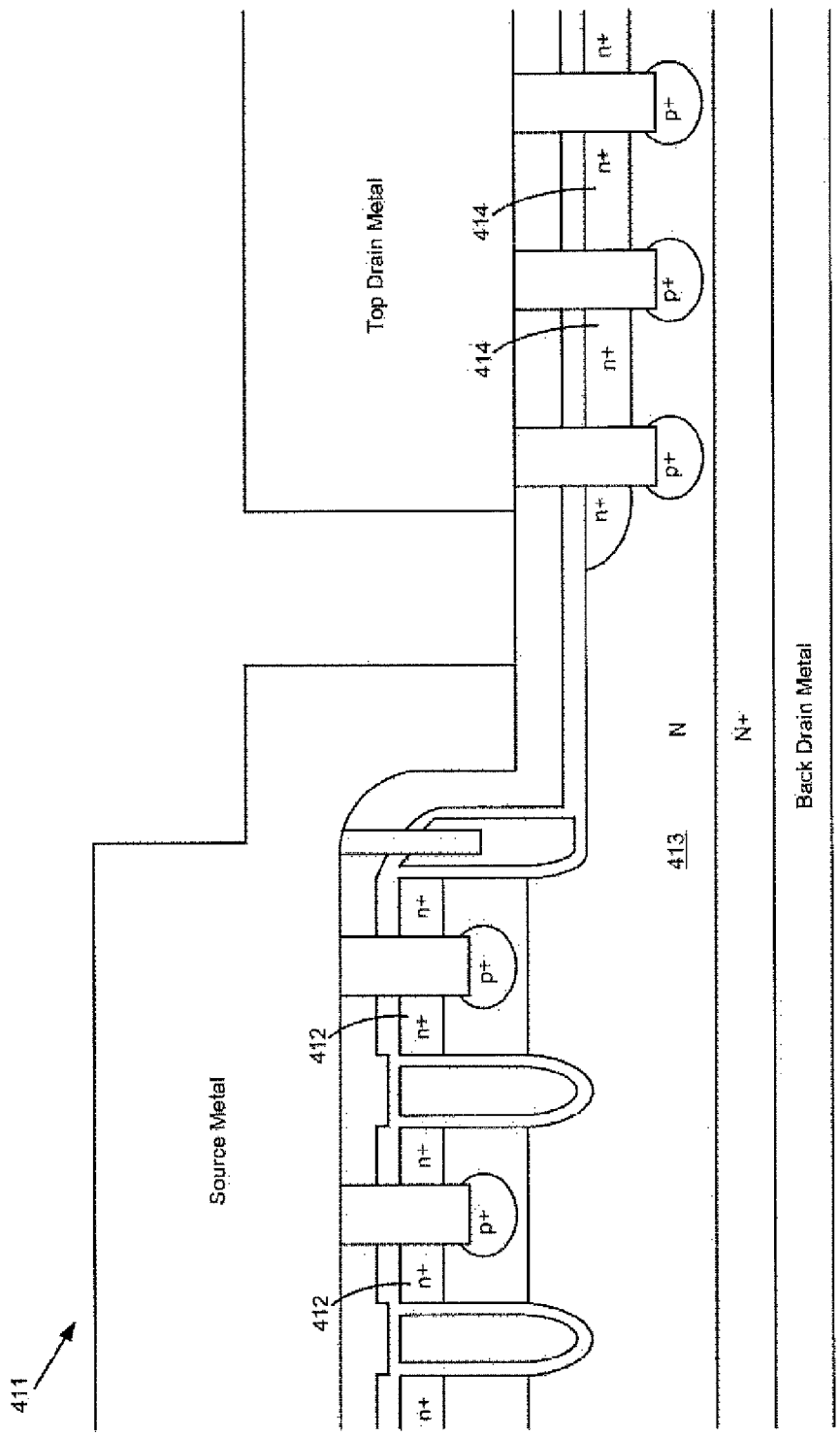
FIG. 4B is a cross-sectional view of another preferred embodiment according to the present invention.

FIG. 4B shows another preferred embodiment according to the present invention, wherein an N-channel trench MOSFET 411 is similar to the trench MOSFET 401 of FIG. 4A except that, in FIG. 4B, the n+ source region 412 is formed by vertical diffusion, therefore has a same doping concentration and a same junction depth at a same distance from a top surface of the N epitaxial layer 413. The n+ source dopant region 414 is formed simultaneously when the n+ source region 412 is formed, therefore has a similar distribution profile to the n+ source region 412.

Figure 5A:
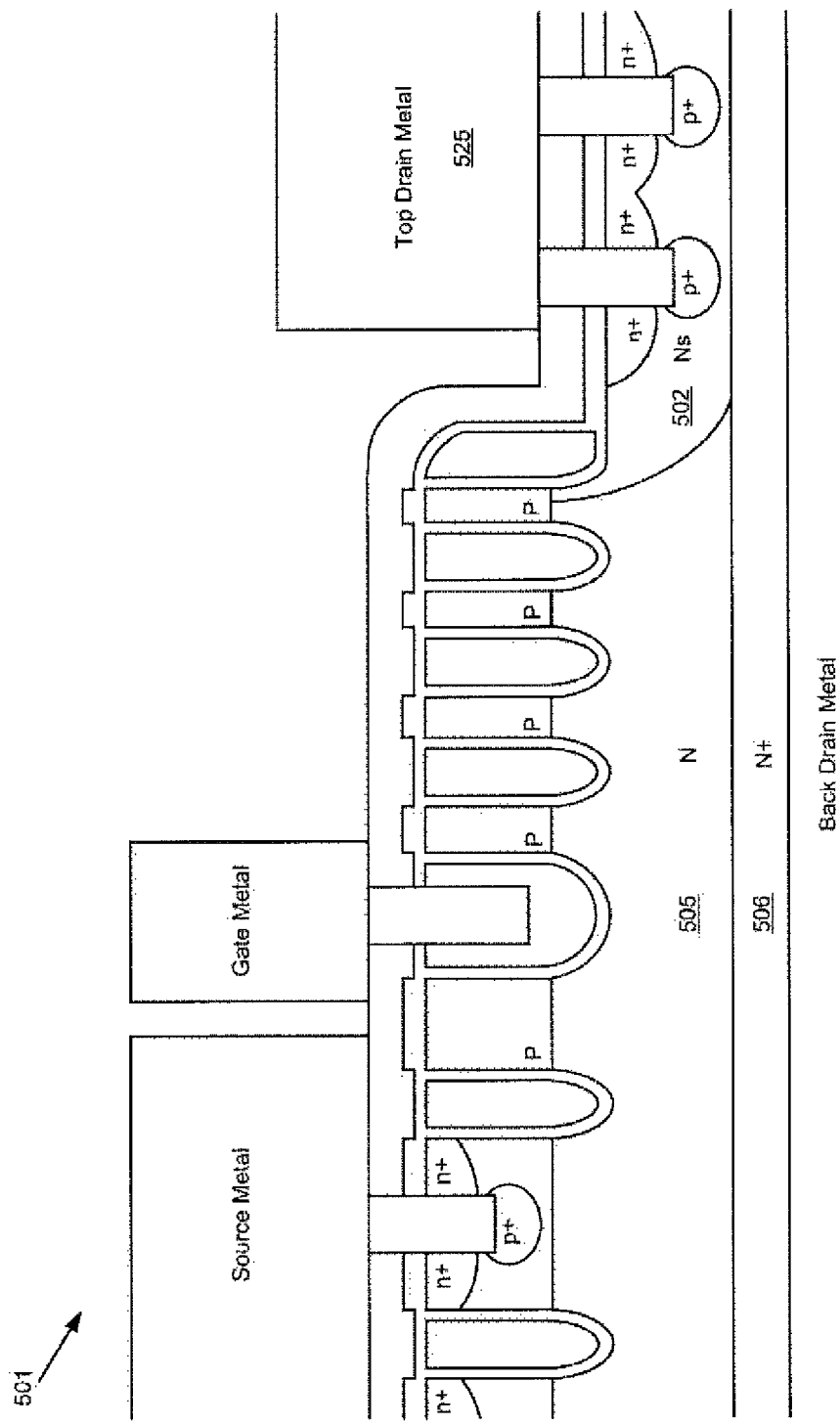
FIG. 5A is a cross-sectional view of another preferred embodiment according to the present invention.

FIG. 5A shows another preferred embodiment according to the present invention, wherein an N-channel trench MOSFET 501 is similar to the trench MOSFET 201 of FIG. 2A except that, in FIG. 5A, the N-channel trench MOSFET 501 further comprises a heavily N doped sinker region 502 (Ns, as illustrated) encompassed in the N epitaxial layer 505 underneath the top drain metal 525 to further reduce Rds. According to FIG. 5A, the heavily N doped sinker region 505 reaches the interface between the N epitaxial layer 505 and the substrate 506.

Figure 5B:
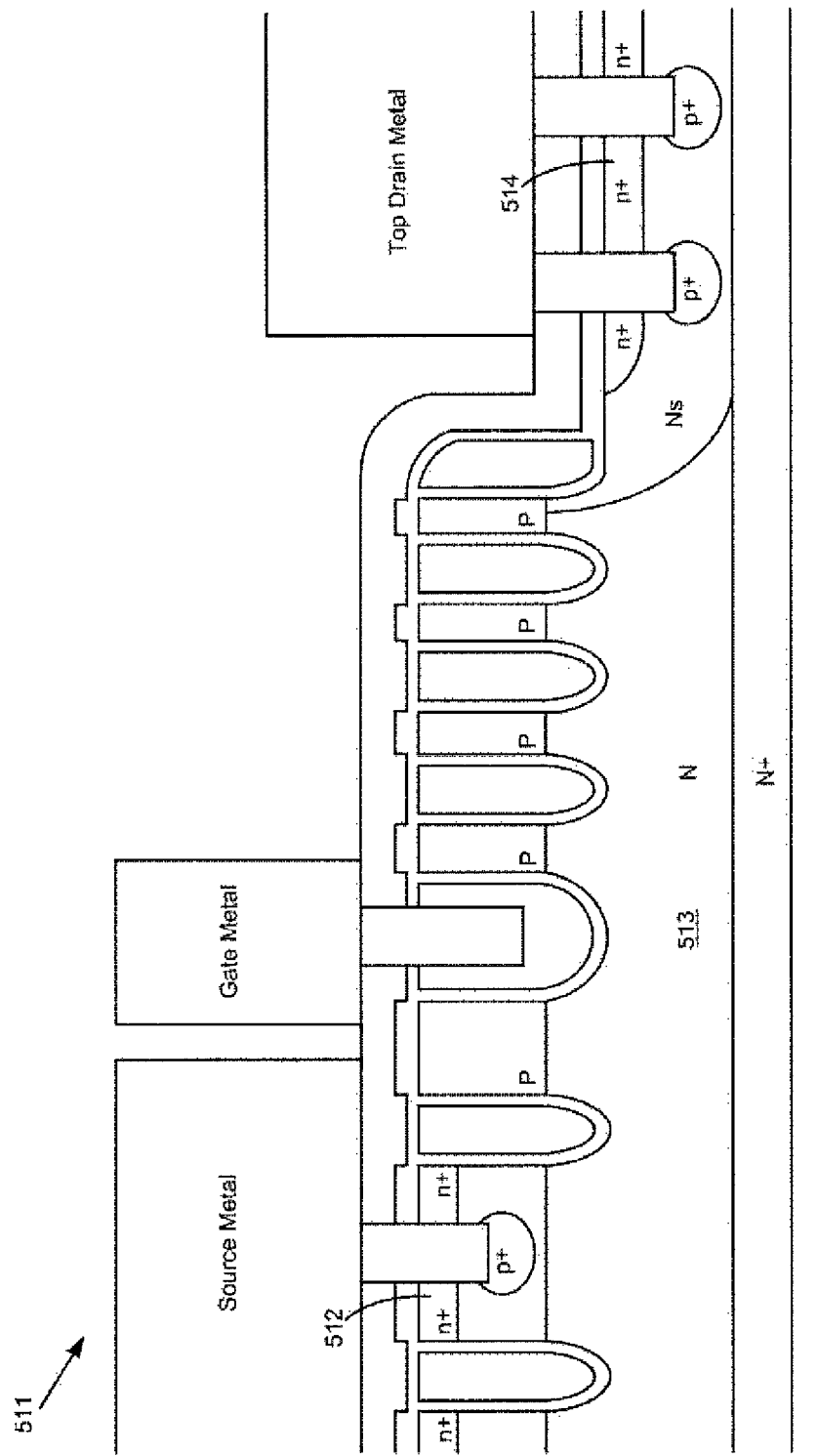
FIG. 5B is a cross-sectional view of another preferred embodiment according to the present invention.

FIG. 5B shows another preferred embodiment according to the present invention, wherein an N-channel trench MOSFET 511 is similar to the trench MOSFET 501 of FIG. 5A except that, in FIG. 5B, the n+ source region 512 is formed by vertical diffusion, therefore has a same doping concentration and a same junction depth at a same distance from a top surface of the N epitaxial layer 513. The n+ source dopant region 514 is formed simultaneously when the n+ source region 512 is formed, therefore has a similar distribution profile to the n+ source region 512.

Figure 5C:
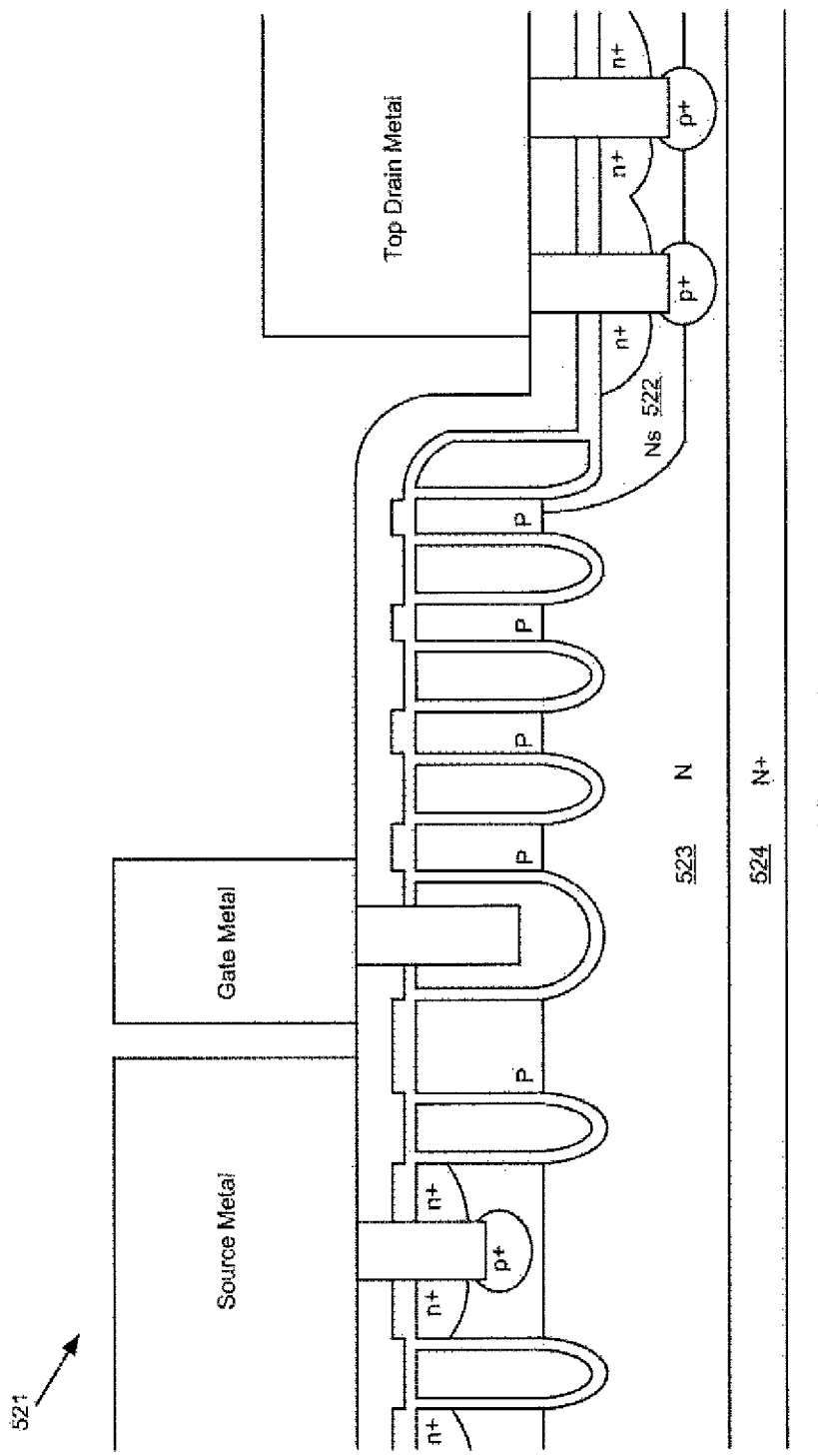
FIG. 5C is a cross-sectional view of another preferred embodiment according to the present invention.

FIG. 5C shows another preferred embodiment according to the present invention, wherein an N-channel trench MOSFET 521 is similar to the trench MOSFET 501 of FIG. 5A except that, in FIG. 5C, the heavily N doped sinker region 522 does not reach the interface between the N epitaxial layer 523 and the N+ substrate 524.

Figure 5D:
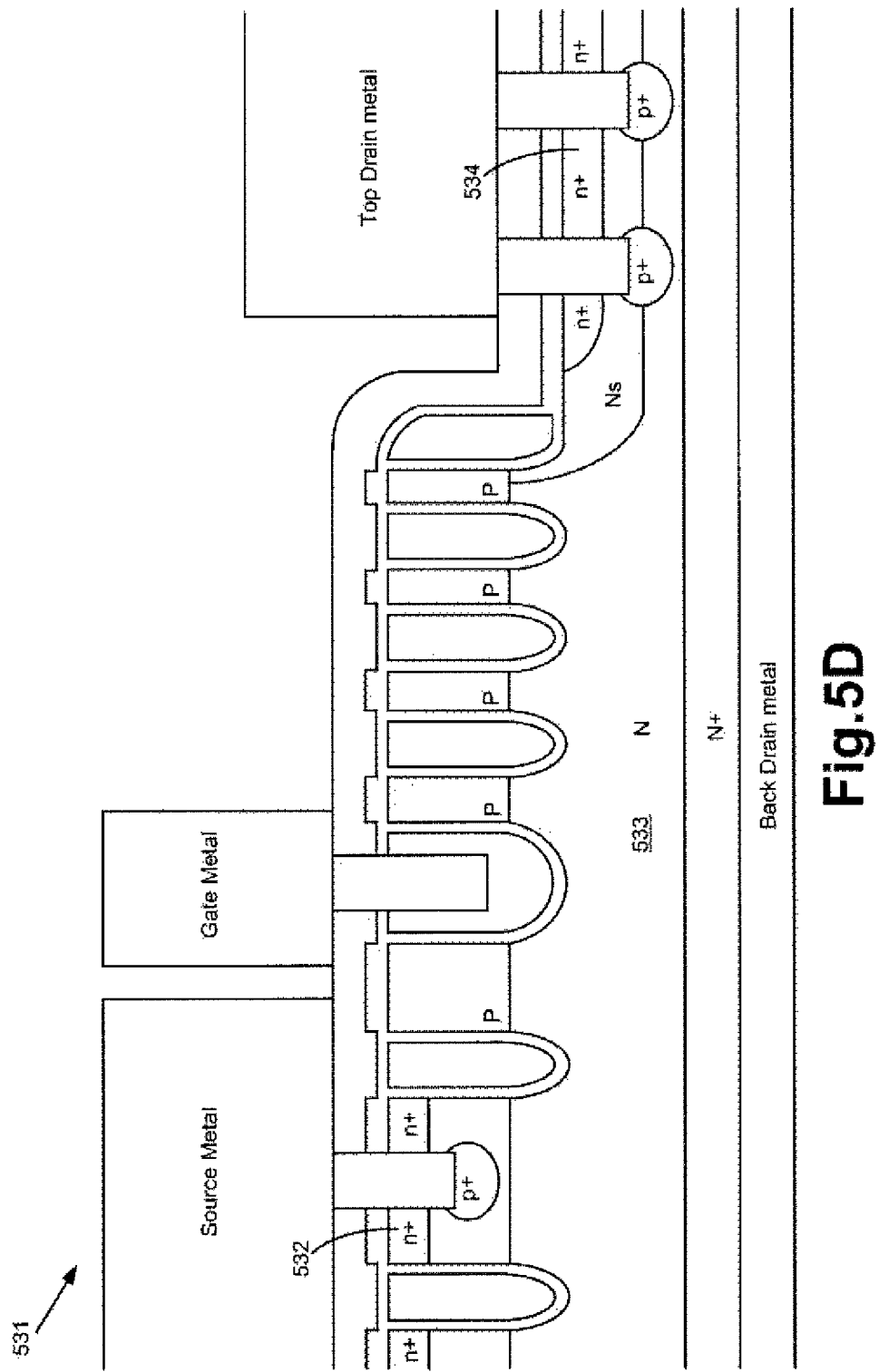
FIG. 5D is a cross-sectional view of another preferred embodiment according to the present invention.

FIG. 5D shows another preferred embodiment according to the present invention, wherein an N-channel trench MOSFET 531 is similar to the trench MOSFET 521 of FIG. 5C except that, in FIG. 5D, the n+ source region 532 is formed by vertical diffusion, therefore has a same doping concentration and a same junction depth at a same distance from a top surface of the N epitaxial layer 533. The n+ source dopant region 534 is formed simultaneously when the n+ source region 532 is formed, therefore has a similar distribution profile to the n+ source region 532.

Figure 6C:
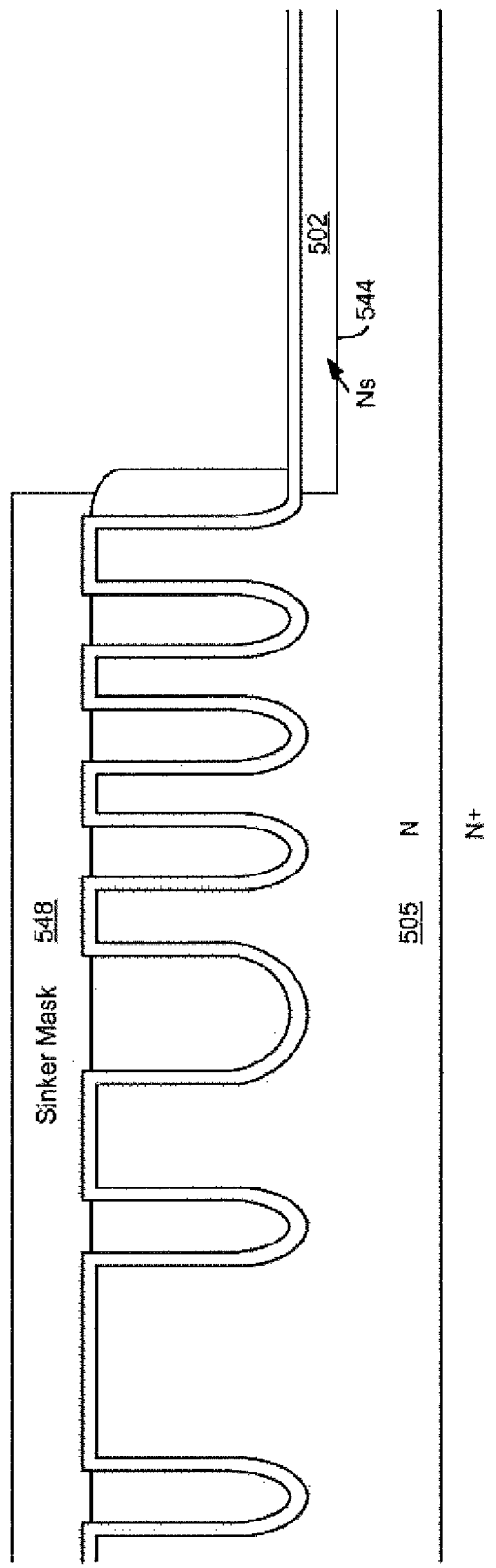

FIGS. 6A~6H are a serial of exemplary steps that are performed to form the inventive trench MOSFET 501 shown in FIG. 5A. Referring to FIG. 6A, an N epitaxial layer 505 is initially grown on a heavily doped N+ substrate 506. Next, a trench mask (not shown) is applied and followed by a trench etching process to define a plurality of trenches in the N epitaxial layer 505, including: a plurality of gate trenches 541 in an active area, a gate contact trench 542 having a greater trench width than the gate trenches 541 for gate connection in a gate contact area, multiple floating trenches 543 for a BV sustaining area and a wide trench 544 for a top side drain in a termination area besides the BV sustaining area. Therefore, the wide trench 544 for the top side drain is formed simultaneously with the gate trenches 541 in the active area and the gate contact trench 542 in the gate contact area, no additional mask is required. Meanwhile, the wide trench 544 for the top side drain is formed in the termination area, therefore chip area is saved because no additional deep trench is required compared to the prior art. Then, a sacrificial oxide layer (not shown) is grown and then etched away to remove the plasma damaged silicon layer formed during the process of opening the trenches. An oxide film is deposited along an inner surface of all the trenches and along a top surface of the N epitaxial layer 505 to function as a gate oxide layer 545. Afterwards, gate material 546, for example a doped poly-silicon layer, is filled into all the trenches and followed by an etching back process as shown in FIG. 6B to leave necessary portion of the gate material 546: within the gate trenches 541 in the active area, within the gate trench 542 in the gate contact area for gate connection, within the floating trenches 543 in the BV sustaining area to form multiple trenched floating gates and covering a sidewall of the wide trench 544 to form a sidewall spacer 547.

In FIG. 6C, a sinker mask 548 is applied on the top surface of the N epitaxial layer 505 to expose the wide trench 544. Then, an ion implantation of Phosphorus dopant is carried out to form a heavily N doped sinker region 502 (Ns, as illustrated) in the N epitaxial layer 505 underneath the wide trench 544. After that, a diffusion step can be optionally performed to further diffuse the Phosphorus dopant in the heavily N doped sinker region 502.

Figure 6D:
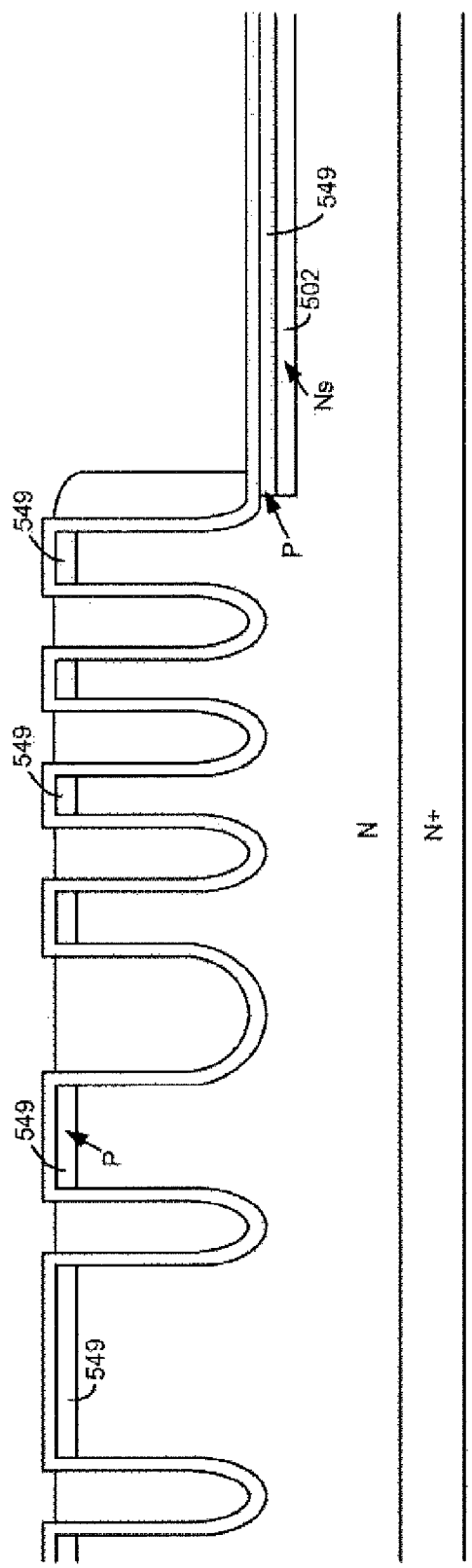

In FIG. 6D, after carrying out a P type dopant ion implantation step without requiring a body mask as shown in FIG. 6D, a plurality of P body regions 549 are formed near the top surface of the N epitaxial layer 505 and near the top surface of the heavily N doped sinker region 502.

Figure 6E:
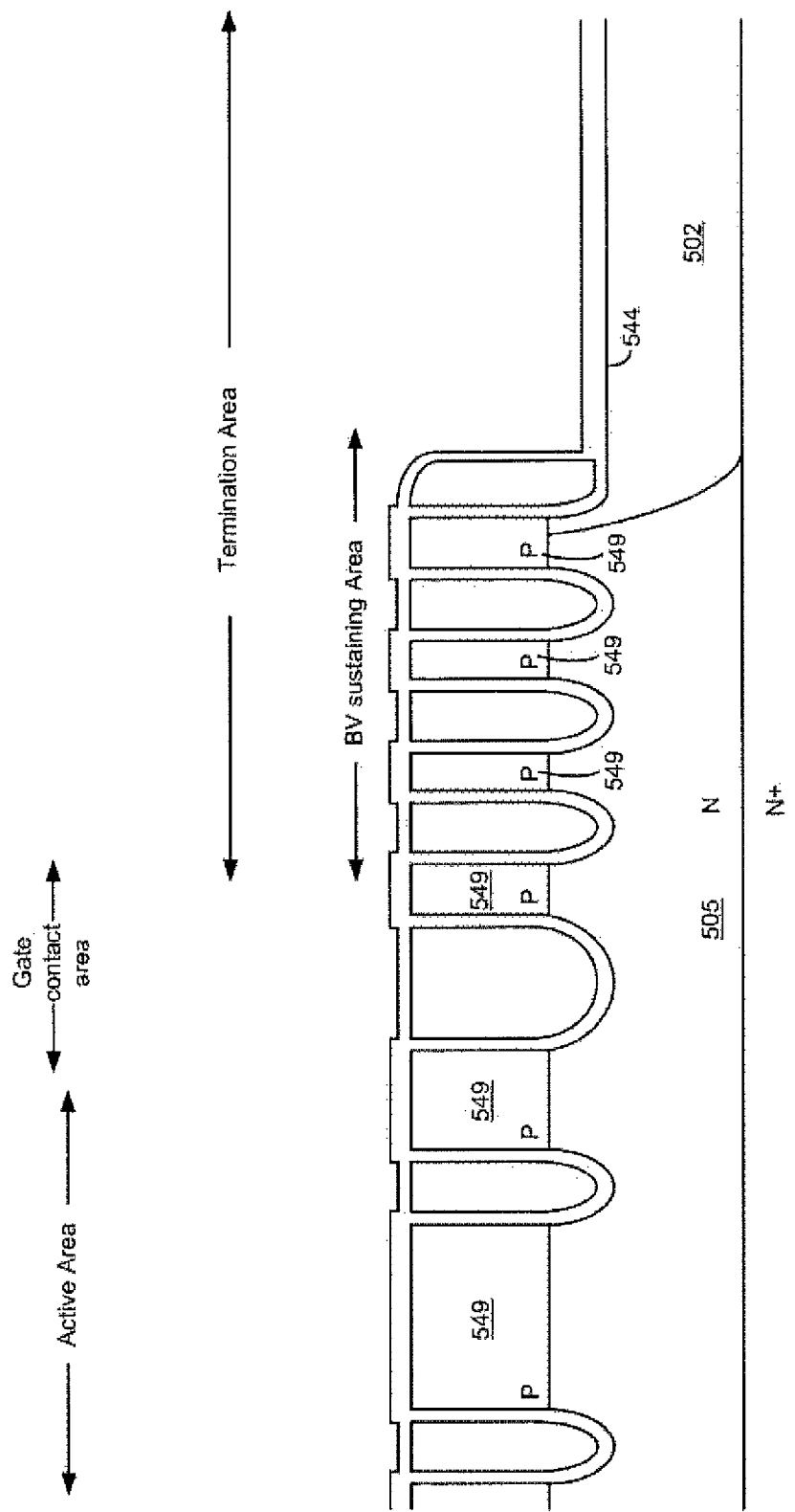

In FIG. 6E, a diffusion step is carried out to diffusion the P body regions 549 to a determined depth which is above bottoms of all the trenches in the active area, the gate contact area and the BV sustaining area. Meanwhile, underneath the wide trench 544, the diffusion step only leaves the sinker region 502 reaching an interface between the N epitaxial layer 505 and the N+ substrate 506.

Figure 6F:
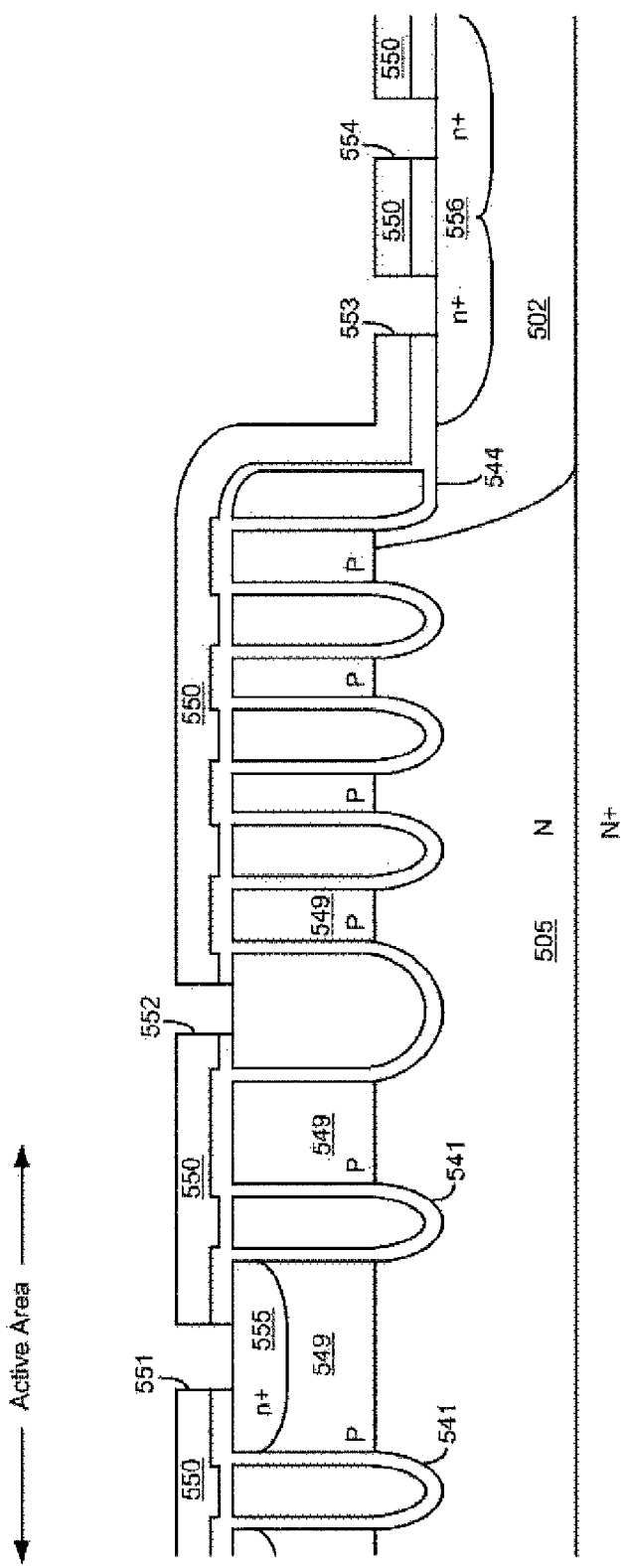

In FIG. 6F, a contact interlayer 550, for example a thick oxide layer is deposited on a top surface of the structure of FIG. 6E. Then, a contact mask (not shown) is employed and then followed by a dry oxide etching process to define a plurality of contact holes (551~554) to expose a part top surface of the N epitaxial layer 505 for a followed n dopant ion implantation step and a diffusion step after which there form an n+ source region 555 without a source mask near a top surface of the P body region 549 in the active area and an n+ source dopant region 556 underneath the wide trench 544. What should be noticed is that, the n+ source region 555 is lateral diffused from center portion under the contact hole 551 to adjacent gate trenches 541, therefore has a higher doping concentration and a greater junction depth near the center portion between two adjacent gate trenches 541 than along adjacent channel regions near the gate trenches 541.

Figure 6G:
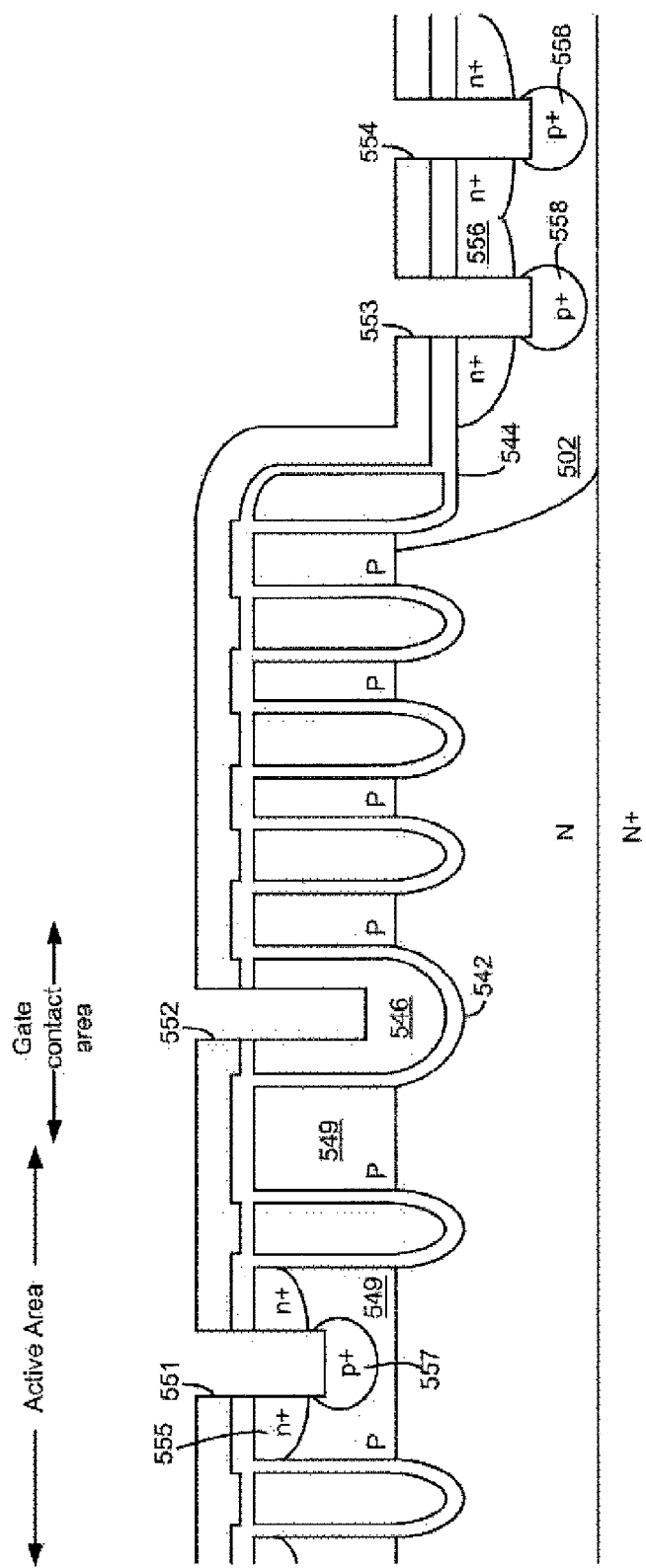

In FIG. 6G, after a dry silicon etching process, the contact holes (551~554) are respectively etched to be extending: into the P body region 549 in the active area after penetrating through the n+ source regions 555, into the gate material 546 filled in the gate contact trench 542 in the gate contact area, and into the sinker region 502 after penetrating through the n+ source dopant region 556 underneath the wide trench 544. Next, after carrying out a BF2 ion implantation and a step of RTA (Rapid Thermal Annealing) process, a p+ body contact doped region 557 is formed underneath the n+ source region 555 and surrounding at least bottom of the contact hole 551, and a p+ body contact dopant region 558 is formed underneath the n+ source dopant region 556 and surrounding at least bottom of each of the contact holes 553 and 554.

Figure 6H:
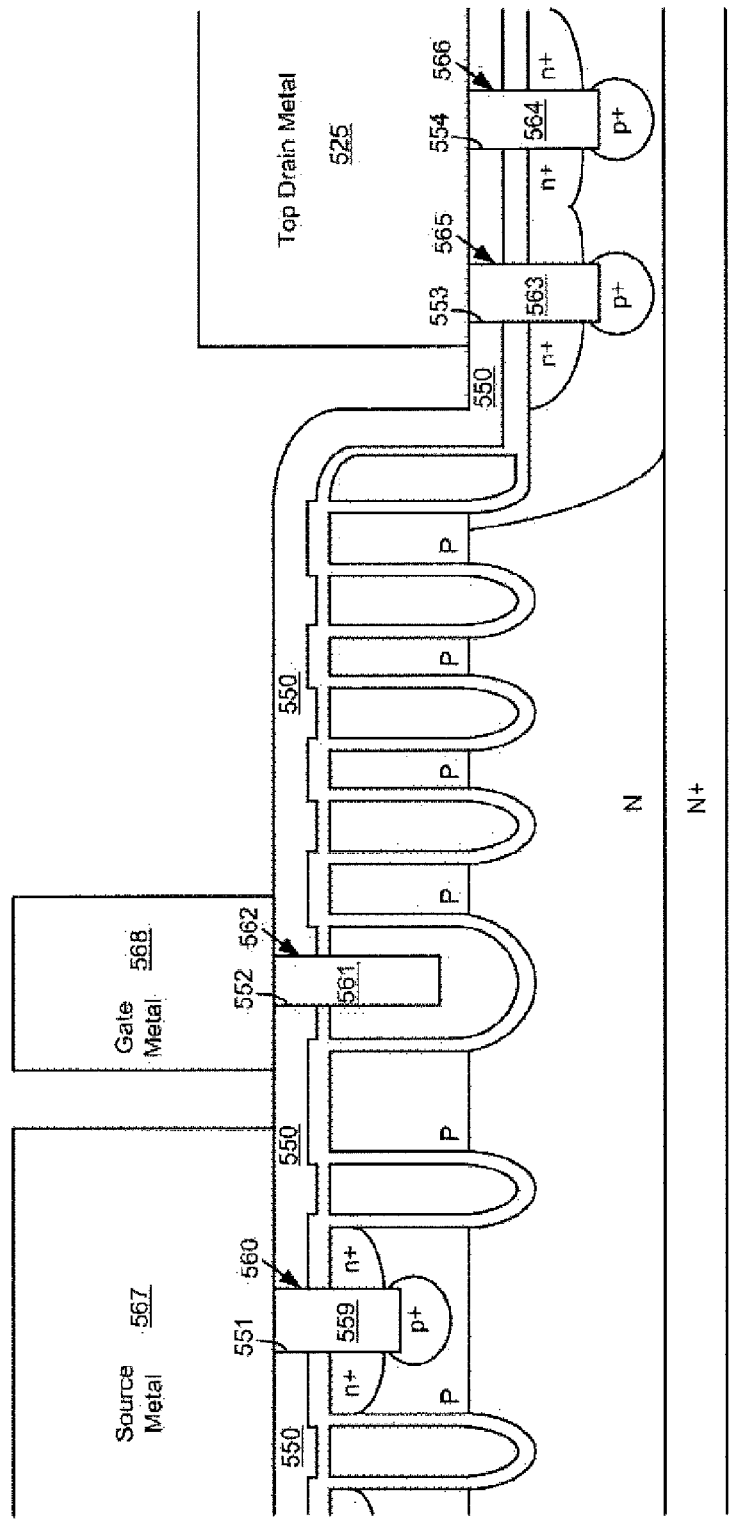

In FIG. 6H, a barrier metal layer of Ti/TiN or Co/TiN or Ta/TiN is deposited on sidewalls and bottoms of all the contact holes (551~554) followed by a step of RTA process for suicide formation. Then, a tungsten material layer is deposited onto the barrier layer, wherein the tungsten material layer and the barrier layer are then etched back to form: a contact metal plug 559 for a trenched source-body contact 560; a contact metal plug 561 for a trenched gate contact 562; and contact metal plugs 563 and 564 for trenched drain contacts 565 and 566. Therefore, the trenched drain contacts 565 and 566 are formed simultaneously as the trenched source-body contact 560 and the trenched gate contact 562. Then, a metal layer of Al alloys or Cu padded by a resistance-reduction layer Ti or Ti/TiN underneath is deposited onto the contact interlayer 550 and followed by a metal etching, process by employing a metal mask (not shown) to form a source metal 567, a gate metal 568 and a top drain metal 525.

Although the present invention has been described in terms of the presently preferred embodiments, it is to be understood that such disclosure is not to be interpreted as limiting. Various alternations and modifications will no doubt become apparent to those skilled in the art reading the above disclosure, Accordingly, it is intended that the appended claims be interpreted as covering all alternations and modifications as fall within the true spirit and scope of the invention.

What is claimed is:

1. A method for manufacturing a trench MOSFET having a top side drain, comprising:

forming an epitaxial layer of a first conductivity type onto a substrate of the first conductivity type, wherein said epitaxial layer has a lower doping concentration than said substrate;

applying a trench mask and etching a plurality of trenches to a determined depth in said epitaxial layer, wherein said trenches include: a plurality of gate trenches in an active area, a gate contact trench in a gate contact area and a wide trench in a termination area;

forming a gate oxide layer along inner surfaces of all said trenches and depositing gate material onto said gate oxide layer to fill into said trenches;

applying a sinker mask and carrying out sinker dopant ion implantation to form a sinker region heavily doped of the first conductivity type in said epitaxial layer underneath said wide trench;

carrying out a body dopant ion implantation over entire top surface without a body mask and performing body diffusion step to form body region of a second conductivity type;

depositing a thick oxide layer onto the entire top surface to function as a contact interlayer;

applying a contact mask and etching said contact interlayer to form a plurality of contact holes to expose a part top surface of said epitaxial layer;

carrying out source dopant ion implantation without a source mask over the entire top surface;

performing a source dopant diffusion to laterally diffuse said source dopant from a center portion between two adjacent gate trenches in said active area to adjacent channel regions;

etching said epitaxial layer to further extend said contact holes in said epitaxial layer;

forming a contact metal plug in each of said contact holes.

\* \* \* \* \*